(12) United States Patent
Soyano et al.

(10) Patent No.: US 6,995,461 B2
(45) Date of Patent: Feb. 7, 2006

(54) SEMICONDUCTOR DEVICE

(75) Inventors: Shin Soyano, Nagano (JP); Eiji Mochizuki, Nagano (JP)

(73) Assignee: Fuji Electric Co., Ltd., Kawasaki (JP)

( * ) Notice: Subject to any disclaimer, the term of this patent is extended or adjusted under 35 U.S.C. 154(b) by 195 days.

(21) Appl. No.: 10/199,507

(22) Filed: Jul. 22, 2002

(65) Prior Publication Data

US 2003/0015778 A1      Jan. 23, 2003

(30) Foreign Application Priority Data

| Jul. 23, 2001 | (JP) | ............................ 2001-220913 |
| Jul. 23, 2001 | (JP) | ............................ 2001-220914 |
| Dec. 17, 2001 | (JP) | ............................ 2001-382405 |

(51) Int. Cl.
| H01L 23/02 | (2006.01) |
| H01L 23/22 | (2006.01) |
| H01L 23/24 | (2006.01) |
| H01L 23/28 | (2006.01) |
| H05K 7/20 | (2006.01) |

(52) U.S. Cl. ..................... 257/678; 257/687; 257/787; 361/688

(58) Field of Classification Search ................ 257/675, 257/687, 692, 696, 787, 678, 676; 361/688, 361/735, 758, 823
See application file for complete search history.

(56) References Cited

U.S. PATENT DOCUMENTS

| 4,322,737 | A | * | 3/1982 | Sliwa, Jr. ..................... 257/719 |
| 5,625,536 | A | * | 4/1997 | Soyano et al. .............. 361/736 |
| 5,751,058 | A | * | 5/1998 | Matsuki ...................... 257/692 |
| 6,396,125 | B1 | | 5/2002 | Soyano |
| 6,521,983 | B1 | * | 2/2003 | Yoshimatsu et al. ........ 257/678 |
| 6,646,884 | B1 | * | 11/2003 | Frisch et al. ................ 361/728 |

FOREIGN PATENT DOCUMENTS

EP              219812  A  *  4/1987

* cited by examiner

*Primary Examiner*—Carl Whitehead, Jr.
*Assistant Examiner*—Heather Doty
(74) *Attorney, Agent, or Firm*—Manabu Kanesaka

(57) ABSTRACT

A semiconductor device includes a package composed of a metal base, an enclosure case integrated with terminals, and a top cover. A power circuit and a control circuit are arranged inside the package vertically, and a gel-like filler is injected to seal the package after being assembled. In this semiconductor device, externally lead control terminals for the control circuit are insert-molded in a control terminal block constituting an independent component. The control terminal block is fixed to the enclosure case to extend over a center of a top surface thereof. A printed circuit board of the control circuit is disposed and connected between the control terminal block and a relay terminal block disposed inside the case.

16 Claims, 10 Drawing Sheets

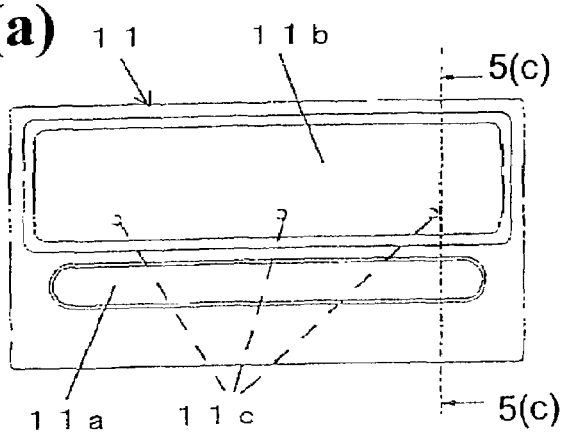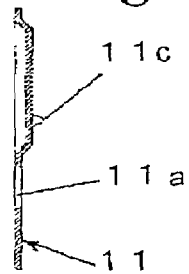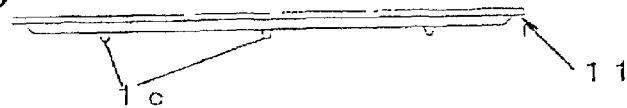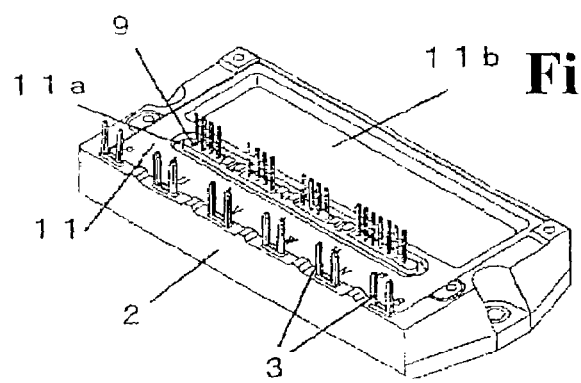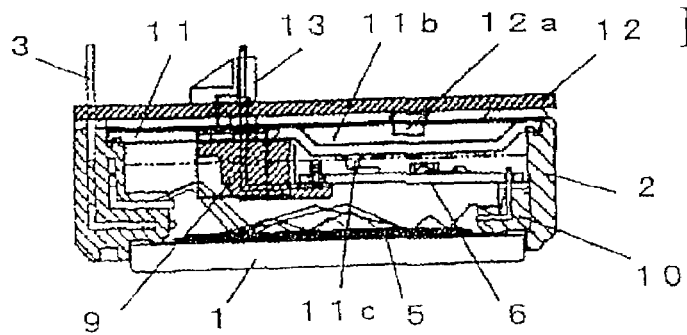

SEMICONDUCTOR DEVICE

BACKGROUND OF THE INVENTION AND RELATED ART STATEMENT

The present invention relates to a semiconductor device applied to an intelligent power module for an inverter apparatus, and more specifically, relates to an assembled structure.

First, an intelligent power module applied to an inverter apparatus will be described as an example of a conventional intelligent power module. An assembled structure of the example is shown in FIGS. 12(a) to 13(b).

In the figures, reference numeral 1 denotes a radiating metal base (a copper base), reference numeral 2 denotes an enclosure case composed of a molded resin integrated with terminals, and reference numeral 3 denotes main terminals (external lead terminals, or screw terminals, for input and output of a power circuit and for a brake circuit). Reference numeral 4 denotes control terminals (external lead terminals, or pin terminals, used to input and output control signals to and from a control circuit), reference numerals 5 and 6 denote a power circuit (a circuit assembly) and a control circuit (a circuit assembly), respectively, and reference numeral 7 denotes bonding wires (internal wiring).

In this case, the power circuit 5 is composed of a circuit board 5a having power semiconductor elements 5b such as IGBTs and free wheeling diodes 5c mounted thereon. The power circuit board 5a is a direct bonding copper substrate composed of a ceramic plate such as alumina or aluminum nitride with a copper circuit pattern directly bonded on a top surface and a copper layer directly bonded on a bottom surface of the ceramic plate, respectively. The control circuit 6 is composed of a printed circuit board 6a with various circuit components including ICs 6b that drive the power elements 5b mounted thereon.

In the assembled structure shown in FIGS. 12(a) and 12(b), the power circuit 5 and the control circuit 6 are mounted on a top surface of the metal base 1 parallel to each other and are assembled as follows: First, the power circuit 5 with the elements mounted thereon is soldered to the metal base plate 1 so that the copper layer of the circuit board 5a faces downward. Next, the printed circuit board 6a of the control circuit 6 with the elements mounted thereon is glued to the metal base plate 1 with adhesive. Subsequently, the bonding wires 7 are connected between the power circuit 5 and the control circuit 6 so as to provide internal wiring for these circuits. Then, the enclosure case 2 integrated with the terminals is placed on the metal base plate 1 and joined thereto with adhesive. Thereafter, the tips of inner leads 3a from the main circuit terminals 3, which project to the interior of the enclosure case 2, are soldered to a conductor pattern on the power circuit board 5a so as to be wired together internally.

Similarly, the control terminals 4 are soldered to the conductor pattern on the control circuit board 6a so as to be wired together internally. In this assembled state, a gel-like filler (for example, a silicone gel) is injected into the package to seal the power circuit 5 and control circuit 6. Finally, a top cover (not shown) is placed on the enclosure case 2 and is glued and fixed thereto.

In the assembled structure in FIGS. 13(a) and 13(b), the power circuit 5 and the control circuit 6 are integrated into the package in a manner of a two-story building. In this case, the power circuit 5 is soldered to the metal base plate 1 as in FIGS. 12(a) and 12(b), whereas the control circuit 6 is assembled as follows: The enclosure case 2 integrated with the terminals is placed on the metal plate 1 having the power circuit 5 mounted thereon, and the main circuit terminals 3 are soldered to the conductor pattern on the power circuit board 5a. Then, a relay terminal block 8 composed of a resin frame 8a molded integrally with terminal conductor pieces 8b is placed on the power circuit 5, and the terminal conductor pieces 8b are soldered to the conductive pattern on the power circuit 5. Then, the printed circuit board 6a of the control circuit 6 is placed on the relay terminal block 8, and then soldered to the terminal conductor pieces 8b and control terminals 4. Subsequently, as described in FIG. 12(b), a gel-like filler is injected into the package, and a top cover is finally placed on the package for assembly.

Conventional semiconductor devices having the assembled structure described previously have the following problems:

(1) In the configuration in FIG. 12(a) and 12(b), the power circuit 5 and the control circuit 6 are flush with each other. Accordingly, the package has a large occupied area, thereby increasing a size of the semiconductor device. Further, when a result of an intermediate product inspection, carried out during an assembly process of the power circuit 5 and the control circuit 6 installed on the metal base plate 1, indicates that any of the circuit components, such as the ICs 6b mounted on the printed circuit board 6a of the control circuit 6, is defective, since the printed circuit board 6a is firmly secured to the metal base plate 1 by adhesive, it is impossible to peel only the printed circuit board 6a off the metal base plate 1 to replace the defective component with a good one, and install the good printed circuit board 6a back into an assembly line. Consequently, the intermediate product assembly must be entirely disposed, thereby resulting in loss of the component.

(2) Further, the two-story building configuration in FIGS. 13(a) and 13(b) is advantageous as a size of the semiconductor can be reduced. Also, when an inspection result of an intermediate test carried out during the assembly process indicates that any of the components of the control circuit is defective, the defective component can easily be replaced with a good one. However, the conventional structure still has the following problems: First, the two-story structure increases an external height of the module. Further, when the control circuit 6, which has substantially the same shape as the power circuit 5, is assembled above the power circuit 5 inside the package, the power circuit 5 is hidden behind the control circuit 6 and becomes invisible from outside. Consequently, an internal structure of the package can not be checked. Furthermore, when the gel-like filler is injected into the package, an injection process takes long time because only a narrow space is left between the enclosure case 2 and a periphery of the printed circuit board 6a of the control circuit 6.

Moreover, to connect the power module and a peripheral circuit (an inverter apparatus) together, the main terminals are conventionally screwed to a bus bar or a printed circuit board of the peripheral circuit, with the control terminals soldered thereto or connected thereto by using a connector. However, a more recent method includes steps of forming a pin terminal structure as the main terminals of the power module, mounting the power module directly on the printed circuit board of the peripheral circuit, and joining the main terminals (the pin terminals) to the circuit board by a solder flow process. The control terminals (the pin terminals) are inserted into a connector provided on the peripheral circuit. On the other hand, in the structure in FIGS. 13(a) and 13(b), the lead pins of the control terminals 4 are molded integrally with the enclosure case 2. Accordingly, to conform a length, the number, and an arrangement of the pin terminals to a user's specification or a connector specification, it is necessary to design and produce a new enclosure case integrated with terminals corresponding to the user's specification, resulting in a higher cost.

The present invention is provided in view of these points, and it is an object of the present invention to provide an improved assembled structure of a semiconductor device to solve the above problems. Also, the assembled structure has improved assembling capability and reliability while taking an advantage of the two-story building scheme, in which a power circuit and a control circuit are arranged parallel to each other in a vertical direction within a package, so that the resultant semiconductor device makes it possible to remove external lead terminals from the control circuit and replace them with good ones in order to easily accommodate the user's desired specification.

Further objects and advantages of the invention will be apparent from the following description of the invention.

SUMMARY OF THE INVENTION

To attain the above objects, the present invention provides a semiconductor device comprising a package composed of a radiating metal base, an enclosure case integrated with terminals and having external lead terminals of a main circuit insert-molded thereon, and a top cover. A power circuit and a control circuit are disposed in the package in a manner of a two-story building, and a gel-like filler is injected to seal the package. The metal base has a power circuit mounted thereon, and the power circuit has power semiconductor elements mounted thereon. The control circuit is arranged above the power circuit and has circuit components including driving ICs for the power semiconductor elements mounted on a printed circuit board.

In the semiconductor device, external lead terminals for the control circuit are insert-molded, as pin terminals, on a terminal block (a molded resin), which is a separate component from the enclosure case. The control terminal block is fixed to the enclosure case so as to extend over a top surface thereof close to a center of the top surface. Tie printed circuit board of the control circuit is supported and connected by soldering between terminal leads projecting from the control terminal block to the interior of the case and terminal leads extending vertically from a relay terminal block disposed inside the enclosure case. Also, the power circuit and the control circuit are interconnected via the relay terminals.

According to the above described assembled structure of the semiconductor device, the power circuit, enclosure case, control terminal block, control circuit, and case top cover can be stacked together from above to be assembled. This structure easily accommodates an automatic assembly method using an assembly robot. Further, a distance of wiring path can be minimized to connect between the main circuit terminals and power circuit, the power circuit and control circuit, and the control circuit and control terminals, thereby preventing malfunction due to an adverse effect of wiring inductance. Furthermore, the gel-like filler can be quickly injected into the package so as to spread over the whole interior thereof.

Moreover, when an intermediate inspection during an assembly process indicates that any of the components such as ICs mounted on the control circuit is defective, the defective control circuit can easily be replaced with a good one by removing a solder junction between the printed circuit board of the control circuit and the terminal leads.

Furthermore, since the control terminal block is assembled in the enclosure case as an independent component, a user's specification can easily be met by combining the enclosure case as a common component and a specific control terminal block compatible with the user's specification.

Further, according to the present invention, each portion of the semiconductor device described previously can be constructed in the following manner:

(1) The ICs mounted on the printed circuit board of the control circuit may be composed of bare chips, thereby reducing a thickness of the package of the semiconductor device containing this printed circuit board.

(2) The ICs mounted on the printed circuit board of the control circuit may be laid out according to an arrangement of the power semiconductor elements mounted on the printed circuit board of the power circuit, so that the power semiconductor elements are arranged parallel to the ICs in the vertical direction. Consequently, a wiring path between the power semiconductor elements and the ICs is minimized to suppress the adverse effect of wiring inductance, while simplifying the circuit patterns on the circuit board and printed circuit board.

(3) The external lead terminals of the main circuit may be composed of pin or plate terminals and specifically arranged on one side of the square enclosure case and parallel with this terminal array. Also, the control terminal block is installed close to a center of the top surface of the enclosure case, and the control circuit is arranged in an area between the control terminal block and a side of the enclosure case opposite to the terminal array. Thus, a wide passage leading to the power circuit is obtained between the control terminal block and a side of the enclosure case closer to the main terminal array, and the gel-like filler is easily injected therethrough.

(4) A terminal leader slot may be opened in a case top cover and is set to be larger than a contour of a top portion of the control terminal block. Thus, when a connector provided on a printed circuit board of an apparatus is inserted into the corresponding control terminals for connection, the above arrangement prevents a tip portion of the connector of the apparatus from abutting against the case top cover to obstruct the connection. Consequently, the connector can be reliably connected to the corresponding control terminals.

(5) Spacing projections may be provided on a back surface of the case top cover, in which a tip of each projection is located opposite a top surface of the printed circuit board of the control circuit. When the case top cover is deformed because of a change in ambient temperature, the projections act as spacers to prevent the bonding wires installed on the printed circuit board from being deformed or crushed against the case top cover.

(6) A recess portion may be formed on the top surface of the case top cover, and the spacing projections in (5) are provided in a dispersed manner on a back surface area of the recess portion formed on the top surface of the case top cover. This arrangement prevents the case top cover from being warped or deformed at the recess portion (which has a higher flexural strength than a flat top cover). A space in the recess portion is also used to prevent interference with electronic components mounted on a back surface of the printed circuit board of the apparatus placed on the semiconductor device.

(7) The control terminal block may be provided with guide pins for positioning parallel to the control terminal array (pin terminals) to support the printed circuit board of the control circuit in such a manner that the guide pins are fitted in the printed circuit board. Thus, when the printed circuit board of the control circuit is integrated into the case with the control terminal block mounted thereon, the guide pins are fitted and inserted into the printed circuit board to support the circuit board in position. Subsequently, the control terminals can be soldered to the printed circuit board easily.

(8) Support portions formed at respective ends of the control terminal block may be fitted from above into recess or groove portions formed in an inner surface of the enclosure case of the package and are joined thereto by adhesive. Here, the support portions of the control terminal block have an adhesive injection hole opened in top surfaces thereof, thereby allowing the adhesive to be efficiently applied using a dispenser. Adhesive guide channels are formed in an inner surface of each recess portion in the case and in an outer surface of each support portion of the block to spread the adhesive injected through the injection hole, over the whole Interface between the block and the recess portion.

(9) In an apparatus assembled by combining cooling fins and a printed circuit board of the apparatus, the cooling fins may be placed on the metal base of the semiconductor device, and main terminals of the semiconductor device are inserted into corresponding terminal insertion holes in the printed circuit board of the apparatus and are then soldered thereto, with the control terminals inserted into a connector installed on the printed circuit board. The main terminals of the semiconductor device are composed of pin-shaped or plate-shaped lead terminals made of easy processing material, and are arranged on the top surface of the package in a line. The lead terminals are each formed correspondingly to a mounting position of the printed circuit board of the apparatus to be combined with the semiconductor device, and a tip of each terminal is inserted into and soldered to the corresponding terminal insertion hole in the printed circuit board. Thus, the main terminals drawn out from the top surface of the package of the semiconductor device (module) are arranged in a line, and the lead terminals thereof are made of an easy processing material.

When an inverter apparatus is constructed by combining the module with the printed circuit board of the apparatus and the cooling fins, even if the module and the printed circuit board of the apparatus must be laid in different directions according to a user's design request, the main terminals of the module can be inserted directly into the terminal insertion holes drilled in the printed circuit board, by forming the main terminals of the module according to the layout so as to change a direction of the tip of each terminal.

Further, the main terminals may be lead terminals made of copper and are plated with nickel, solder, or gold to improve soldering characteristic of the copper lead terminals, bonding characteristic of the wires, and contact characteristic of the connectors.

Furthermore, the tip of each main terminal may be formed in a character L shape, and the main terminals may be laterally inserted into the corresponding terminal insertion holes for junction, in which holes are drilled along an edge of the printed circuit board of the apparatus so that the printed circuit board is mounted perpendicular to the semiconductor device. In this assembled structure, when the apparatus is laid out so that the cooling fins and the semiconductor device (module) are arranged on a rear surface of a unit case, and the printed circuit board of the apparatus is laid in a depth direction of the unit case and arranged in front of the semiconductor device (module), the printed circuit board can be mounted perpendicular to the semiconductor device (module) by laterally fitting and inserting the main terminals (lead terminals), bending like the character L, into the corresponding terminal insertion holes of the printed circuit board.

BRIEF DESCRIPTION OF THE DRAWINGS

FIGS. 1(a) and 1(b) are views showing an assembled structure of a semiconductor device according to an example of the present invention, wherein FIG. 1(a) is a plan view showing a state that a case top cover is removed, and FIG. 1(b) is a sectional view taken along line 1(b)–1(b) in FIG. 1(a);

FIGS. 3(a) and 3(b) are views showing a state that an enclosure case is combined with the assembly in FIG. 2 with wire bonding applied to the power circuit, wherein FIG. 3(a) is a plan view and FIG. 3(b) is a sectional view taken along line 3(b)–3(b) in FIG. 3(a);

FIGS. 4(a)–4(c) are views showing a finished product with the case top cover placed on the assembly in FIGS. 1(a) and 1(b), wherein FIG. 4(a) is a plan view, FIG. 4(b) is a sectional view taken along line 4(b)–4(b) in FIG. 4(a), and FIG. 4(c) is a perspective view;

FIGS. 5(a)–5(c) are views showing a configuration of a case top cover according to a modified-example of the present invention, wherein FIG. 5(a) is a plan view, FIG. 5(b) is a side view, and FIG. 5(c) is a sectional view taken along line 5(c)–5(c) in FIG. 5(a);

FIG. 6 is a perspective view of a semiconductor device with the case top cover in FIG. 5 installed therein;

FIG. 7 is a sectional view of an assembled structure of a semiconductor device according to a modified example of the present invention;

FIGS. 8(a)–8(b) are views showing an applied example of a control terminal block, wherein FIG. 8(a) is a plan view showing a state that a case top cover is removed, and FIG. 8(b) is a side sectional view of FIG. 8(a);

FIGS. 9(a)–9(b) are views showing a configuration of an essential part of the control terminal block in FIGS. 8(a) and 8(b), wherein FIG. 9(a) is an exploded perspective view of an enclosure case and the control terminal block, and FIG. 9(b) is an enlarged plan view of recess portions formed on the enclosure case;

FIGS. 10(a)–10(b) are views illustrating an assembling process of a module and a printed circuit board according an modified example of the present invention, wherein FIG. 10(a) is a perspective view showing a state before the module and the printed circuit board are assembled, and FIG. 10(b) is a perspective view showing a state that the module and the printed circuit board are assembled;

FIGS. 12(a)–12(b) are views showing an assembled structure of an example of a conventional semiconductor device, wherein FIG. 12(a) is an exploded perspective view and FIG. 12(b) is a perspective view after assembly; and FIGS. 13(a)–13(b) are views showing an assembled structure of an example of a conventional two-story semiconductor device, wherein FIG. 13(a) is an exploded perspective view and FIG. 13(b) is a perspective view after assembly.

DETAILED DESCRIPTION OF THE PREFERRED EMBODIMENT

Figure 1A:
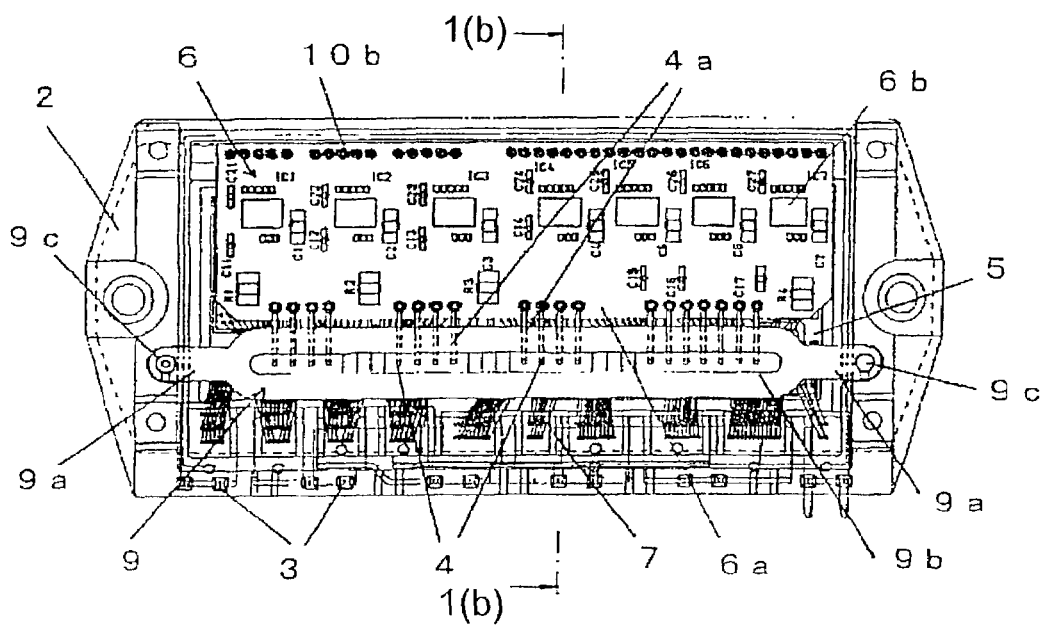

Hereunder, embodiments of the present invention will be described with reference to the accompanied drawings, using a power module applied to an inverter (three-phase) apparatus as an example.

In the embodiments, members corresponding to FIGS. 12(a)–13(b) are denoted by the same reference numerals, thus description thereof is omitted. Further, in the figures of the embodiments, reference numeral 9 denotes a control terminal block assembled on a top surface side of an enclosure case 2 as an independent component; reference numeral 10 denotes a relay terminal block disposed along an inner peripheral side edge of the enclosure case 2; and reference numeral 11 denotes a case top cover placed on the top surface of the enclosure case 2. Furthermore, among terminal symbols marked on the case top cover in FIG. 4(a), reference characters P and N denote DC input terminals; reference characters U, V, and W denote AC output terminals for the respective phases; and reference numeral B denotes a terminal for a brake section. Reference numerals 1', 5', 9', 13' and 19' denote the terminal numbers of the control terminals.

Figure 1B:
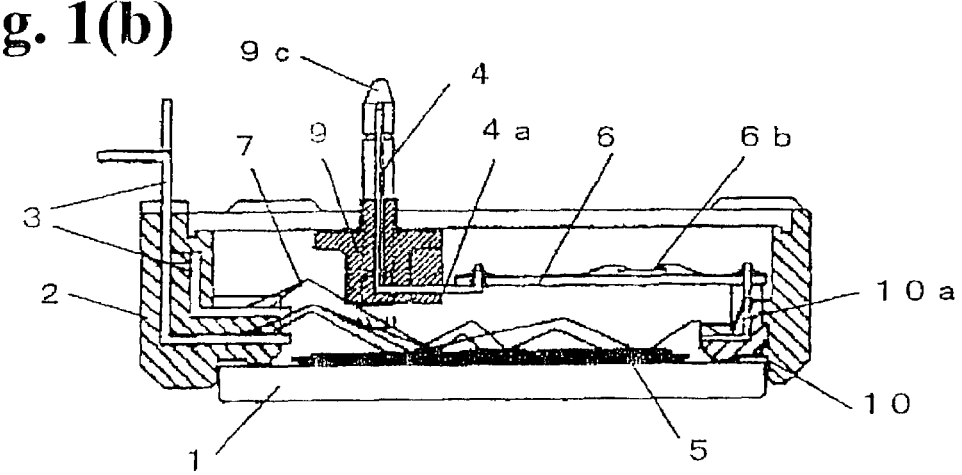

First, FIGS. 1(a) and 1(b) show an entire structure of an example of the present invention. In the assembled structure of the illustrated example, like a module based on a two-story construction shown in FIGS. 12(a)–12(b), a power circuit 5 and a control circuit 6 are integrated into a package in a manner of two-story building. The package is composed of a combination of a metal base 1, a rectangular enclosure case (a resin case) 2, and a case top cover 11. in this case, ICs 6b mounted on a printed circuit board 6a of the control circuit 6 are composed of bare chips, thereby reducing a thickness of the module. The ICs 6b are laid out corresponding to power semiconductor elements (IGBTs) 5b mounted on a circuit board 5a of the power circuit 5 in a line, thereby minimizing a length of wiring path between the power circuit 5 and the control circuit 6 to suppress an adverse effect of wiring inductance.

Figure 3A:
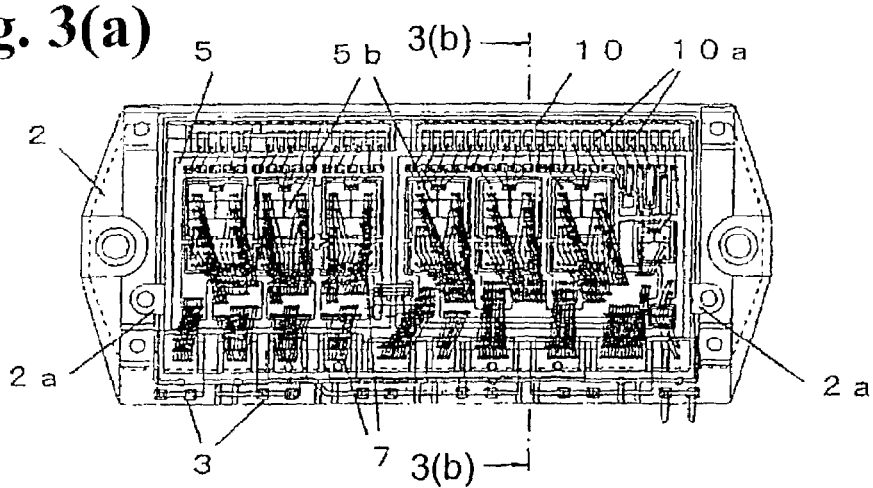

In this case, the enclosure case 2 has main terminals made of copper frames (P, N, U, V, W, and B) integrally insert-molded with a case on one of the longer ones of the four peripheral sides thereof. These pin-shaped terminals project upward from the enclosure case 2. Furthermore, as shown in FIG. 3(a), the enclosure case 2 has stepped recess portions 2a (see FIGS. 3(a)–3(b) and 9(a)–9(b)) each being formed in a top surface of the corresponding shorter side thereof at a position away from the main terminal array and close to a center of the side. A control terminal block, described later, is fitted and supported in the recess portions 2a.

Further, a control terminal block 9 is composed of an independent component and extended on a top surface of the enclosure case 2 between the recess portions 2a. That is, support portions 9a formed at respective ends of a horizontally long resin block member are each fitted into the corresponding recess portion 2a, formed in an inner edge of the enclosure case 2, and are then joined and fixed thereto with adhesive. Furthermore, control terminals 4 as pin terminals are insert-molded on a top portion 9b of the block member so as to form a traverse row and project upward. The top portion 9b projects outward from a top surface of the block member in a trapezoidal form. Terminal leads (inner leads) 4a of the control terminals 4 are bent to form a character L and are drawn out sideward from the block (away from an array of the main terminals 3), and leg portions of the terminal leads located at tips thereof are bent upward. Reference numeral 9c denotes connector guide pins installed at the respective ends of the control terminal block 9.

Further, the relay terminal block 10 provided inside the enclosure case 2 has L-shaped terminal leads 10a insert-molded in the resin block so that one end of the terminal lead 10a extends upward from the top surface of the block. The relay terminal block 10 is bonded to the enclosure case 2 along an inner surface thereof (a longer side opposite to the one with the main terminals 3 arranged thereon) and faces the control terminal block 9. A top surface of the relay terminal block 10 is set at the same height as that of the leg portions of the terminal leads 4a drawn out from the control terminal block 9 to the interior of the case.

Then, a printed circuit board 6a of the control circuit 6 is extended and supported between the terminal leads 4a of the control terminals 4 drawn out from the control terminal block 9 to the interior of the case and the terminal leads 10a extending vertically from the relay terminal block 10. Each tip of the terminal leads 4a and 10a is inserted into and soldered to the corresponding through-hole in the printed circuit board 6.

Figure 4A:
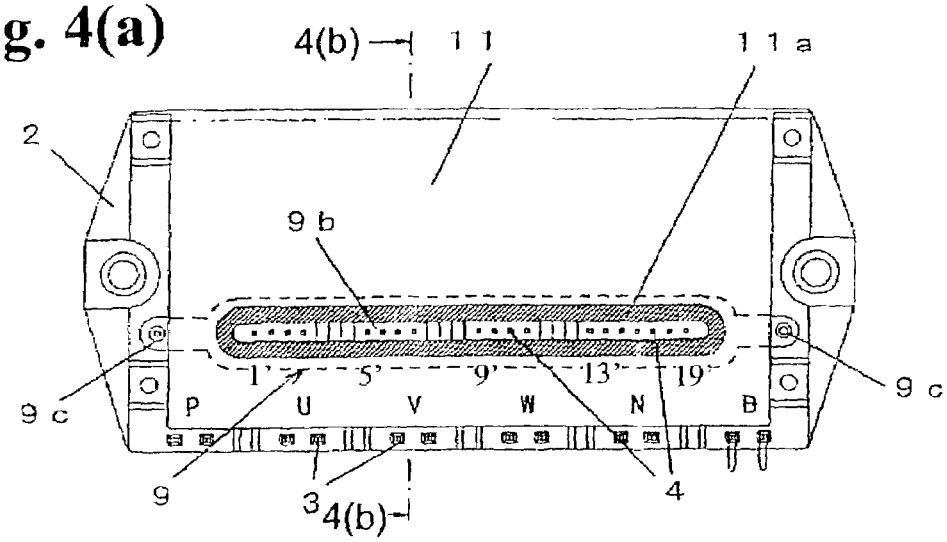
Figure 4B:
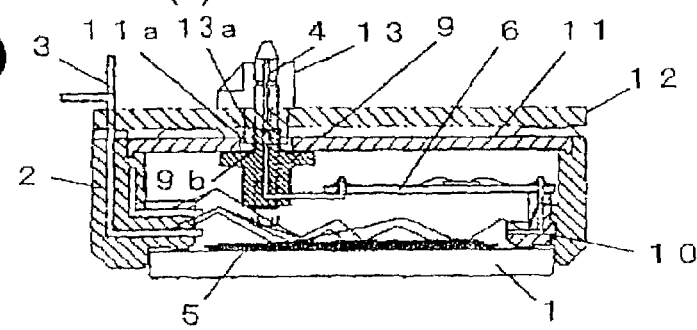
Figure 4C:
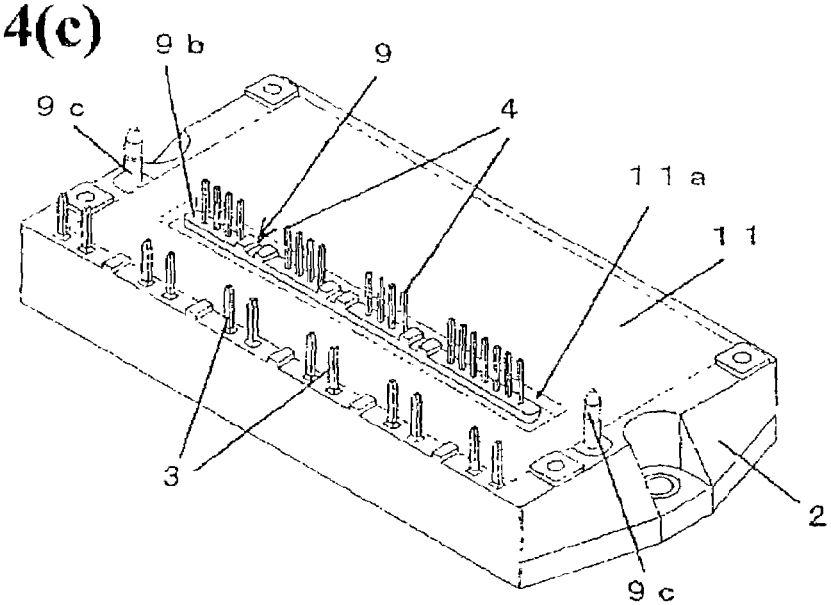

Furthermore, as shown in FIGS. 4(a)–4(c), the case top cover 11 placed on the enclosure case 2 has a terminal leader slot 11a with an opening corresponding to the control terminal block 9. The terminal leader slot 11a is set to be larger than a contour of the trapezoidal top portion 9b of the control terminal block 9, which has the control terminals 4 arranged in a traverse direction. When the top cover 11 is placed as shown in the figure, a recess portion remains between the terminal leader slot 11a and the top portion 9b of the control terminal block. Further, when the top cover 11 is set, a peripheral portion of the control terminal block 9 overlaps a back surface of the top cover 11 to block the slot from the inner surface side thereof. In this manner, the terminal leader slot 11a is formed in the case top cover 11. Consequently, when the power module is combined with a printed circuit board 12 of an apparatus and a connector 13 provided on the printed circuit board is inserted into the control terminals 4, the above arrangement prevents feet of the terminals 13a of the connector, which project from a back surface of the printed circuit board 12, from contacting and interfering with the top cover 11 of the module.

Figure 2:
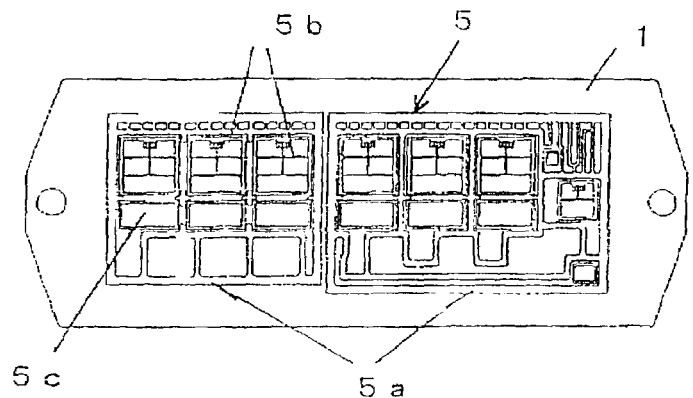
FIG. 2 is a plan view showing a state that the power circuit in FIGS. 1(a) and 1(b) is mounted on a metal base.
Figure 3B:
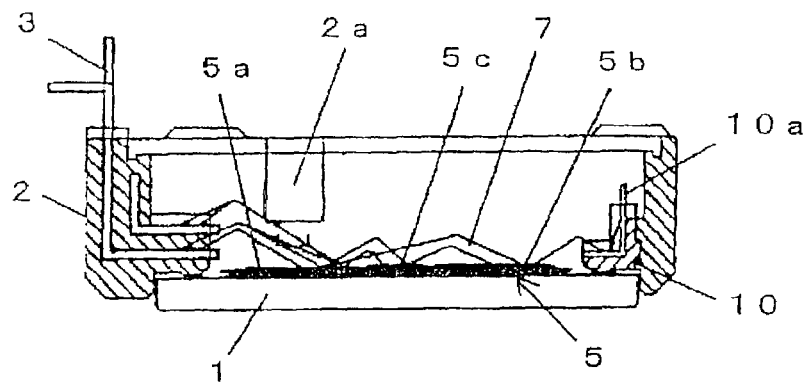

Next, an assembly process of a semiconductor device constructed as described above will be described. First, as shown in FIGS. 2(a)–2(c), the circuit board 5a having the elements of the power circuit 5 mounted thereon is soldered to the metal base 1. Then, as shown in FIGS. 3(a) and 3(b), the enclosure case 2 is placed on the metal base 1 and joined thereto with adhesive. Subsequently, bonding wires 7 are installed between the power semiconductor elements 5b, diodes 5c and a conductor pattern on the circuit board 5a, and between the circuit board 5a and both the main terminals 3 provided on the enclosure case and the terminal leads 10a of the relay terminal block 10.

Next, the control terminal block 9 is assembled on the enclosure case 2 from above. The support portions 9a of the respective ends of the block 9 are fitted and temporarily fixed to the right and left recesses 2a (see FIGS. 3(a)–3(b)) formed in the case, and are then joined thereto with adhesive. In the next assembly step, the printed circuit board 6a of the control circuit 6 is inserted into the enclosure case 2 from above and extended between the terminals leads 4a of the control terminals 4 projecting from the control terminal block 9 to the interior of the case and the terminal leads 10a extending upward from the relay terminal block 10. Thereafter, the printed circuit board 6a is soldered to the terminal leads 4a and 10a. Thus, the shortest wiring path is obtained to connect between the main terminals 3 and power circuit 5, the power circuit 5 and control circuit 6, and the control circuit 6 and control terminals 4.

Next, in a filler injection step, a gel-like filler (silicone gel) is injected into the enclosure case 2. In this case, the filler is injected into a gap between the power circuit 5 and the control circuit 6 through an injection passage, i.e. an opening left between the control terminal block 9 and a peripheral frame of the enclosure case on which the main terminals 3 are arranged. The interior of the case is entirely filled with the filler to seal the power circuit 5 and the control circuit 6. Then, in the final assembly step, the case top cover 11 is placed on the enclosure case 2 by aligning the control terminal block 9 with the terminal leader slot 11a opened in the case top cover 11. The case top cover 11 and the enclosure case 2 are then joined together with adhesive. Thus, the power module product shown in FIG. 4(c) is completed.

Now, a modified example of the present invention for the case top cover 11 described above will be described with reference to FIGS. 5(a)–5(c), 6 and 7. That is, in the module assembled state shown in FIGS. 4(a)–4(c), it is necessary to ensure a predetermined gap between the case top cover 11 placed on the top surface of the enclosure case 2 and the printed circuit board 6a of the control circuit 6 integrated into the case, so that the top surface will not interfere with the ICs and various components mounted on the control circuit 6 as well as the bonding wires 7.

When the case top cover 11 is made of a flat resin plate with the terminal leader slot 11a opened therein as shown in FIGS. 4(a)–4(c) and has its board thickness reduced in order to reduce a thickness of the package, the case top cover tends to be warped or deformed when the ambient temperature changes because of a heat cycle. Furthermore, when the top cover 11 is warped and thus recessed, a gap between the top cover 11 and the printed circuit board 6a of the control circuit 6 is narrowed. Consequently, the top cover 11 may crush the bonding wires 7, resulting in an unexpected short circuit.

Thus, in this example as shown in FIGS. 5(a)–5(c), the case top cover 11 has a downwardly recess portion 11b formed at sides of the terminal leader slot 11a to face the printed circuit board 6a of the control circuit 6. The recess portion 11b has spacing projections 11c formed on a back surface thereof so that tips of the projections face the printed circuit board 6a. The projections 11c are set to have such a height that once the module has been assembled, the projections 11c face the top surface of the printed circuit board 6a so as to leave a small gap therebetween.

With such a configuration, even if the case top cover 11 is warped due to a heat cycle, the projections 11c abut against the top surface of the printed circuit board 6a to maintain a predetermined interval between the top cover 11 and the printed circuit board 6a. Accordingly, the top cover 11 will not crush the bonding wires as well. Further, the recess portion 11b of the case top cover 11 increases a dimensional factor and thus a flexural modulus of the top cover. Furthermore, when the printed circuit board 12 of a peripheral circuit is placed on the module as shown in FIG. 7, even if the printed circuit board 12 has an electronic component 12a mounted on a back surface thereof, the printed circuit board 12 can be mounted on the module without unwanted interference between the electronic component 12a and the top cover 11.

Now, a modified example of the present invention for the control terminal block 9 will be described with reference to FIGS. 8(a)–8(b) and 9(a)–9(b). In the assembled structure of the module shown in FIGS. 1(a)–1(b), the printed circuit board 6a of the control circuit 6 is extended and supported between the terminal leads 4a of the control terminals (pin terminals) 4, which are insert-molded on the control terminal block 9 and drawn out to the interior, and the lead terminals 10a extending upward from the relay terminal block 10. Then, the tip of each lead terminal is inserted into and soldered to the corresponding through-hole drilled in the printed circuit board 6a. However, these terminal leads 4a and 10a are easily deformed. Thus, when the printed circuit board 6a is being integrated into the case and abuts against any terminal lead, the terminal leads will be easily deformed and can not be appropriately fitted into the corresponding through-hole in the printed circuit board 6, thereby affecting the subsequent soldering step.

Figure 8A:
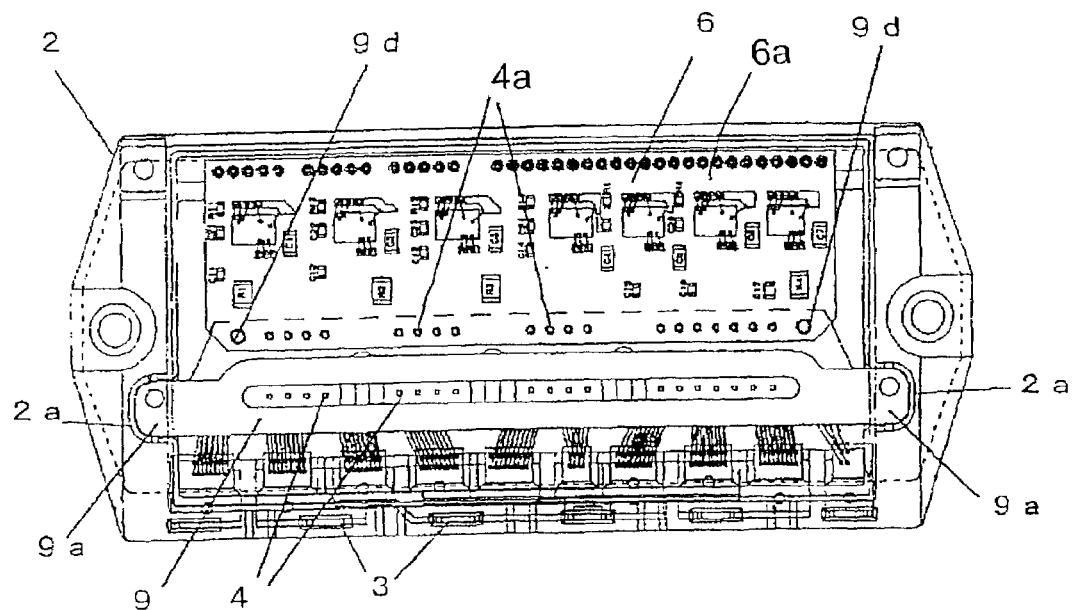
Figure 8B:
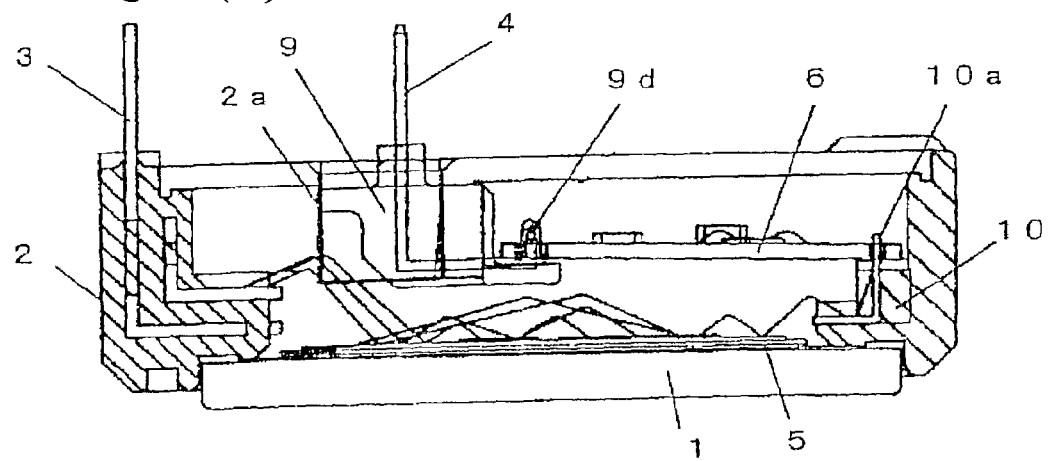

Thus, in this example as shown in FIGS. 8(a) and 8(b), the control terminal block 9 is formed so that the resin block protrudes sideward from a lower end of the control terminal block 9 along a longitudinal direction thereof. Guide pins 9d (set to be longer than a leg portion of the terminal lead 4a) are molded integrally with the resin block at both ends and parallel to the terminal leads 4a of the control terminals 4, which are drawn out from the protruded resin block portion and extend upward. Guide pin holes are drilled at opposite ends of the printed circuit board 6a so as to correspond to the guide pins 9d.

Then, in a assembly step of the printed circuit board 6a of the control circuit 6, when the printed circuit board 6a is placed over the guide pins 9d so that the pins 9d can be fitted and inserted into the circuit board 6a, the circuit board 6a is guided by the guide pins 9d and set in a proper position. Thus, the terminal leads 4a and 10a of the control terminals 4 and relay terminal block 10, respectively, are appropriately fitted into the corresponding terminal through-holes drilled in the circuit board. Then, the subsequent operation of soldering the terminals can be smoothly performed. Furthermore, since the printed circuit board 6a has the control terminal block 9 protruding from the back surface thereof, a melted solder ball during the soldering process is prevented from falling onto the power circuit 5 (see FIG. 8(b)).

Further, this example takes the following measures in order to improve the step of fitting the control terminal block 9 into the recesses 2a in the enclosure case 2 and bonding the block 9 to the grooves 2a with adhesive. If the adhesive is applied to the inner surface of the recesses 2a before the support portions 9a of the control terminal block are fitted into the grooves 2a for junction, it is very difficult to apply the adhesive uniformly to the inner wall surface of the grooves using a dispenser (robot operation) due to a small size of the recess portions 2a.

Figure 9A:
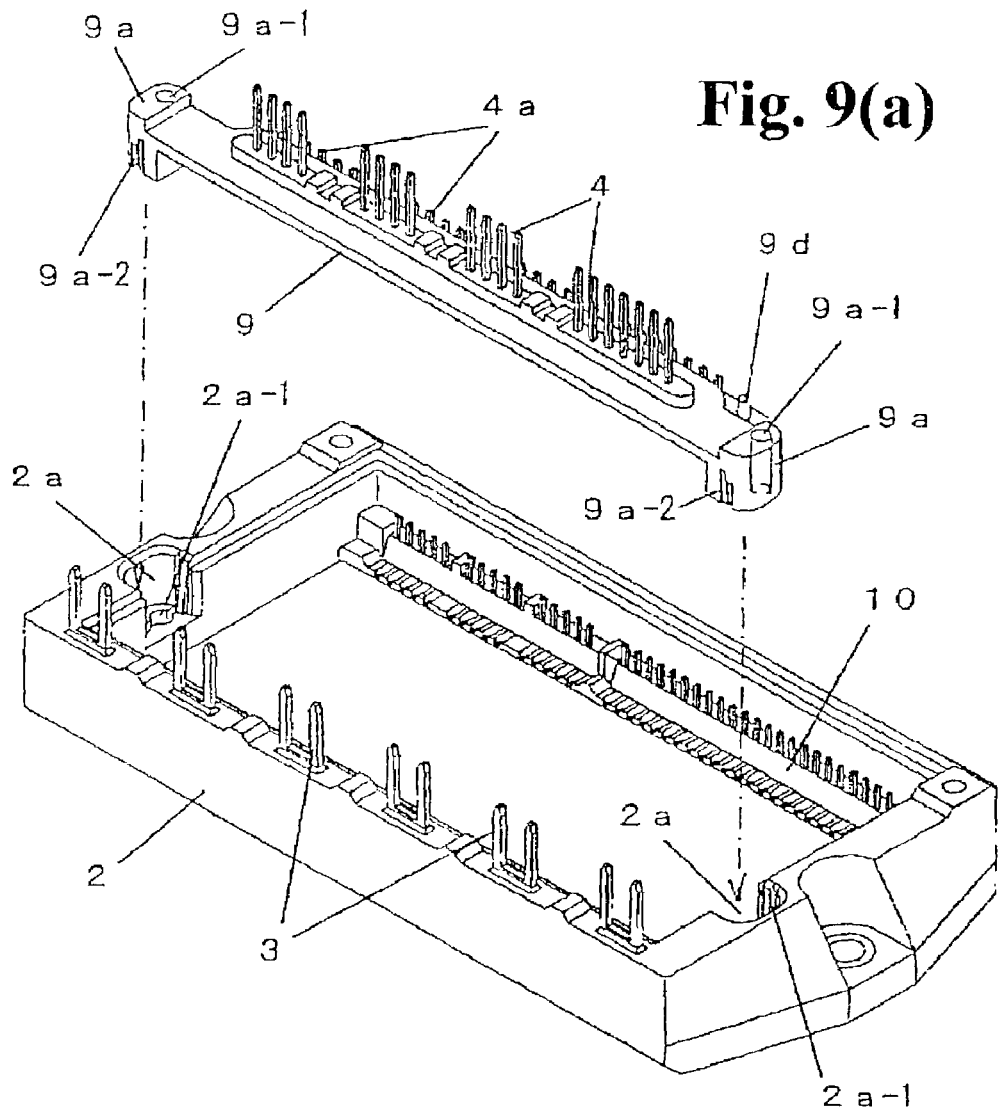
Figure 9B:
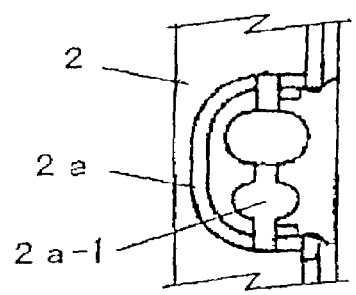

Thus, in this example as shown in FIGS. 9(a) and 9(b), the support portions 9a of the control terminal block 9 have adhesive injection holes 9a-1 drilled therein such that the adhesive can penetrate therethrough in a vertical direction. The support portion 9a also has an adhesive guide channel 9a-2 carved in an outer peripheral surface thereof. The stepped recess 2a formed in the enclosure case 2 also has an adhesive guide channel 2a-1 carved in bottom and inner surfaces thereof.

In the assembly step of installing the control terminal block 9 on the enclosure case 2, the support portions 9a located at the respective ends of the control terminal block 9 are first fitted into the right and left recess portions 2a formed in the enclosure case from above. Subsequently, using a robot operation, an adhesive dispenser nozzle is aligned with the adhesive injection hole 9a-1 and then a specified amount of adhesive is injected into the hole under a pressure. Then, the adhesive flows through the injection hole 9a-1 to the bottom surface of the recess portion 2a, from which the adhesive spreads over the whole interface through the adhesive guide channels 2a-1 and 9a-2. As a result, the terminal block 9 can be reliably joined to the enclosure case.

Each of the adhesive injection holes 9a-1 is also used as the guide pin 9c of the socket shown in FIGS. 1(a)–1(b). After the adhesive is injected, the guide pin 9c is pressed into the corresponding adhesive injection hole 9a-1 so as to be glued and fixed thereto.

Figure 10A:
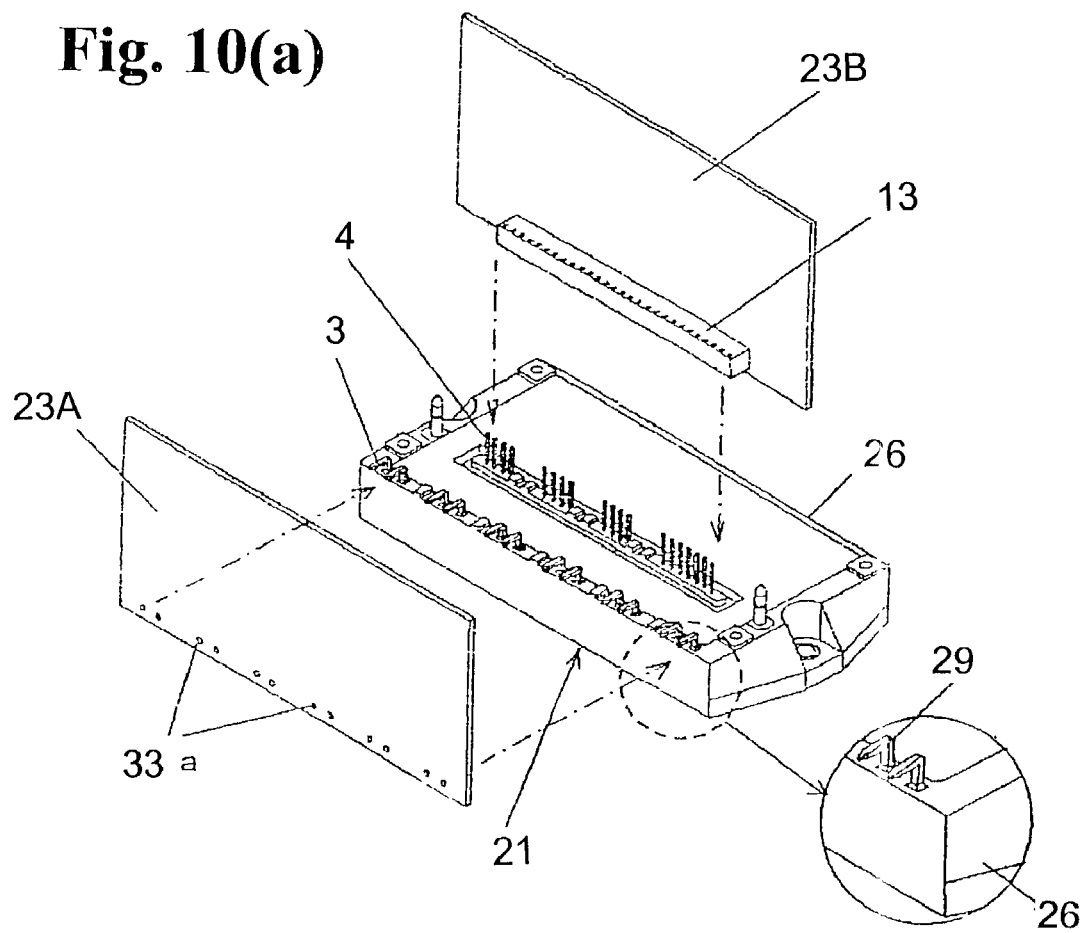
Figure 10B:
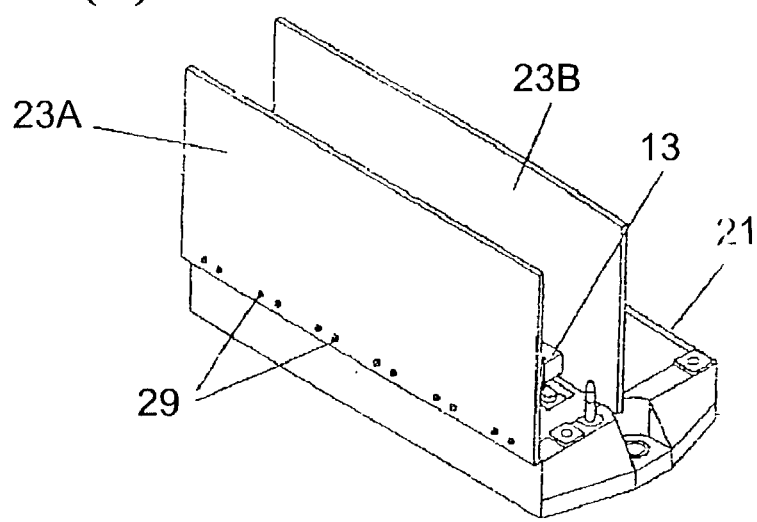

Next, with reference to FIGS. 10(a)–10(b) and 11, a modified example of the present invention for an inverter apparatus assembled by combining the module with cooling fins and a printed circuit board of a peripheral circuit of an apparatus will be explained. In FIGS. 10(a)–10(b), reference numeral 21 denotes an IPM constituting an inverter circuit, and reference numeral 23 denotes a printed circuit board constituting a circuit of the apparatus (a control and protection circuit of the inverter apparatus) to be combined with the IPM 21. Reference numeral 24 denotes a unit case housing the above components and provided with input and output sockets and a display panel on a front surface thereof, and reference numeral 25 denotes radiating cooling fins installed in a rear surface of the unit case 24 and coupled to the IPM 21 so as to transmit heat thereto.

Further, as shown in FIGS. 1(a) and 1(b), the IPM 21 comprises a package composed of the metal base 1, the enclosure case 2 formed of resin molding, and the top cover, and containing the main circuit 5 as a power circuit and the control circuit 6 constructed in the manner of a two-story building. The package is also provided with the main terminals 3 acting as external lead terminals for input to and output from the main circuit 5, the control terminals (signal terminals) 4 acting as external lead terminals for the control circuit 6, and the relay terminals 10a connecting the main circuit 5 and the control circuit 6 together.

Here, the main circuit 5 is a circuit assembly having power semiconductor elements (for example, IGBTs) mounted therein and combined with free wheeling diodes. The main circuit 5 is mounted on the metal base 1 by soldering. Further, the control circuit 6 has circuit components such as driving ICs for the power semiconductor elements mounted on a circuit board. The control circuit 6 is extended between lead leg portions of the control terminals 4 and the relay terminals 10a, extending upward, and is arranged above the main circuit 5.

The main terminals 3 are insert-molded integrally with a peripheral wall portion of the enclosure case 2 and are drawn out from the top surface of the package by extending a tip of each terminal upward. Further, the control terminals 4 are insert-molded as pin terminals on the control terminal block 9 to be an independent component composed of a molded resin. The control terminal block 9 is then assembled to the enclosure case 2 so as to extend over the top surface of the case 2 close to the center thereof. The control terminals 4 are then allowed to penetrate the case top cover and drawn out from the top surface thereof. The control terminal block 9 also has guide pins installed at the respective ends thereof. Reference numeral 7 denotes bonding wires installed between the main circuit 5 and the main terminals 3 and between the main circuit 5 and the relay terminals 11.

In the conventional assembled structure, when the above described inverter apparatus is constructed, the printed circuit board 23 of the apparatus is placed on the IPM 21 so that its surface is positioned parallel to the top surface of the package of the module. Then, the main terminals 3 extending vertically from the top surface of the package are directly inserted into the terminal insertion holes drilled in the printed circuit board. Consequently, an arrangement of the IPM 21, printed circuit board 3 of the apparatus, and cooling fins 25 assembled in the unit case 24 is limited.

There may be a case that an arrangement of the IPM and the printed circuit board does not conform to the user's specific configuration. For example, suppose that a user's design requires that the cooling fins 25, which are otherwise arranged on a side of the unit case 24 in a control panel, be shifted to the rear surface of the case 24. If the IPM 21 is shifted to the rear surface of the unit case 24 together with the cooling fins 25, the direction of the main terminals 3 extending frontward from the package of the IPM 21 is at right angles to the direction of the terminal insertion holes drilled in the printed circuit board 23 laid in the longitudinal direction of the apparatus. In this state, the main terminals 3 can not directly inserted into and soldered to the printed circuit board 23.

Thus, the main circuit terminals drawn out from the top surface of the package of the module are arranged in a line, and the lead terminals are made of a flexible material. Then, when the module is to be combined with the printed circuit board of the apparatus and the cooling fins to construct an inverter apparatus, even if the user's design requires that the module and the printed circuit board of the apparatus be positioned in different directions, the main circuit terminals of the module can be directly inserted into the terminal insertion holes drilled in the printed circuit board for connection by forming the main circuit terminals of the module according to the layout so as to change the direction of the tip of each terminal.

To achieve this, the following operations must be performed:

(1) The main terminals of the module are composed of lead terminals made of copper. These lead terminals are plated with nickel, solder, or gold, thereby improving soldering of the copper lead terminals, bonding of the wires, and contact with the connectors.

(2) The tip of each main terminal of the module is formed in a character L shape, and the main terminals are inserted into the corresponding terminal insertion holes drilled in the edge of the printed circuit board, so that the printed circuit board of the apparatus is mounted perpendicular to the power module. When the apparatus is laid out so that the cooling fins and the module are arranged on the rear surface of the unit case, and the printed circuit board of the apparatus is laid in the depth direction of the unit case and arranged in front of the module, the printed circuit board can be mounted perpendicular to the module by laterally fitting and inserting the main terminals (lead terminals) of the module, which are bent like the character L, into the corresponding terminal insertion holes of the printed circuit board.

That is, the IPM 21, in particular the main terminals 3, is composed of pin- or plate-like lead terminals made of a material that can easily be processed (JIS C1100, C1020, C2600, or C2680). Furthermore, the terminals are plated with nickel with a thickness of 10 $\mu$m or less, solder with a thickness of 10 $\mu$m or less, or gold (for gold plating, Ni plating is made under the gold plating) with a thickness of 2 $\mu$m or less, so that the terminals can appropriately get wet with the solder and can be appropriately connected to the bonding wires.

Then, when the IPM 21 is combined with the cooling fins 25 and the printed circuit board of the apparatus to constitute an inverter apparatus, the main terminals 3 extending vertically from the top surface of the package of the IPM 21 are formed (bent) correspondingly to a position of the printed circuit board 23 to be combined with the module. The main terminals 3 are then directly inserted into and soldered to the corresponding terminal insertion holes drilled in the printed circuit board 23 to assemble the apparatus.

Figure 11:
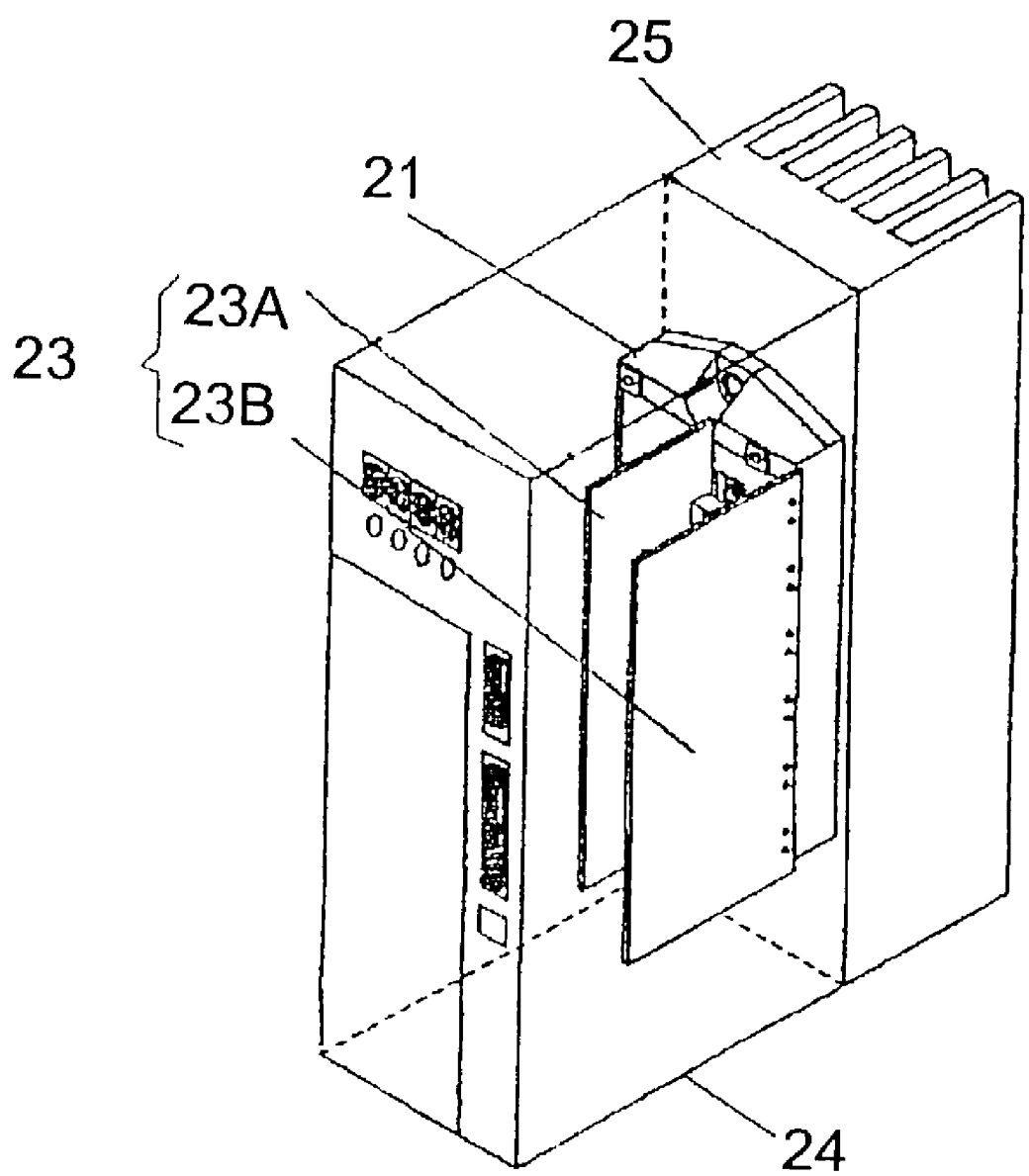
FIG. 11 is a view showing an assembled structure of an inverter apparatus corresponding to FIGS. 10(a) and 10(b)
Figure 12A:
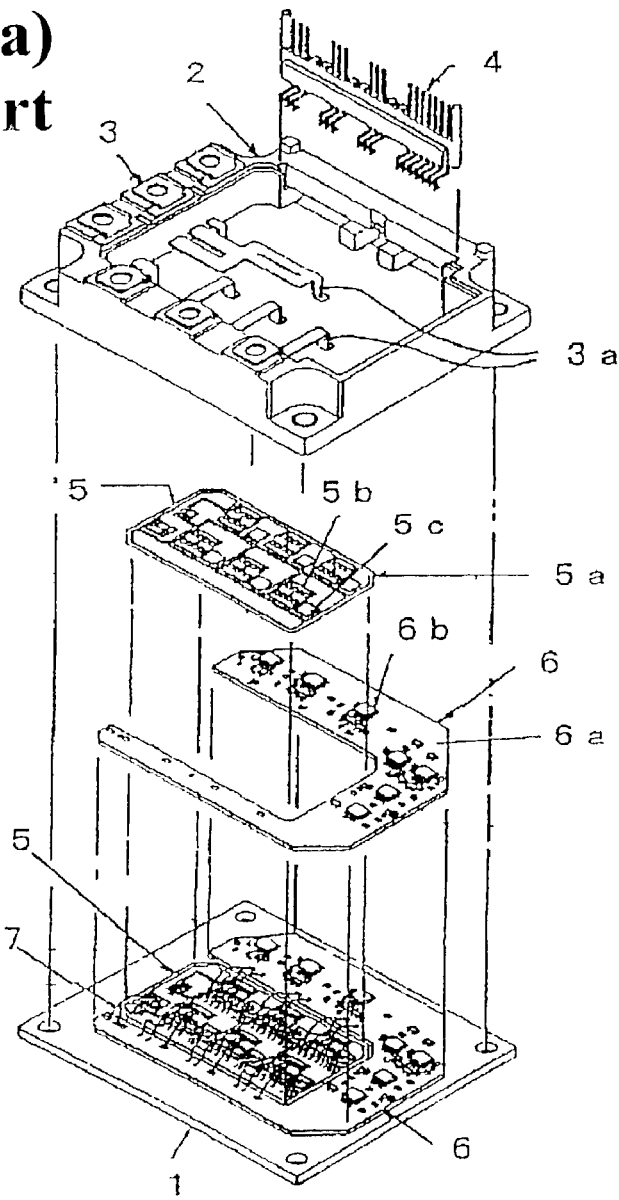
Figure 12B:
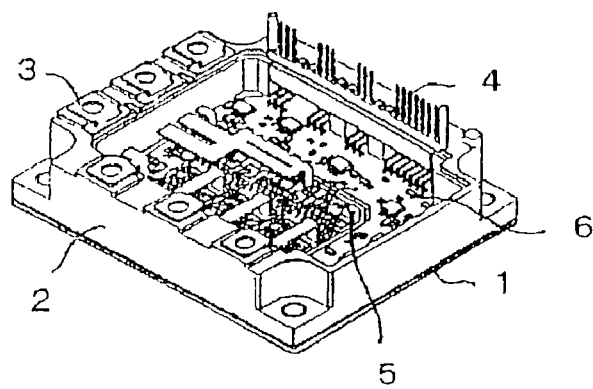
Figure 13A:
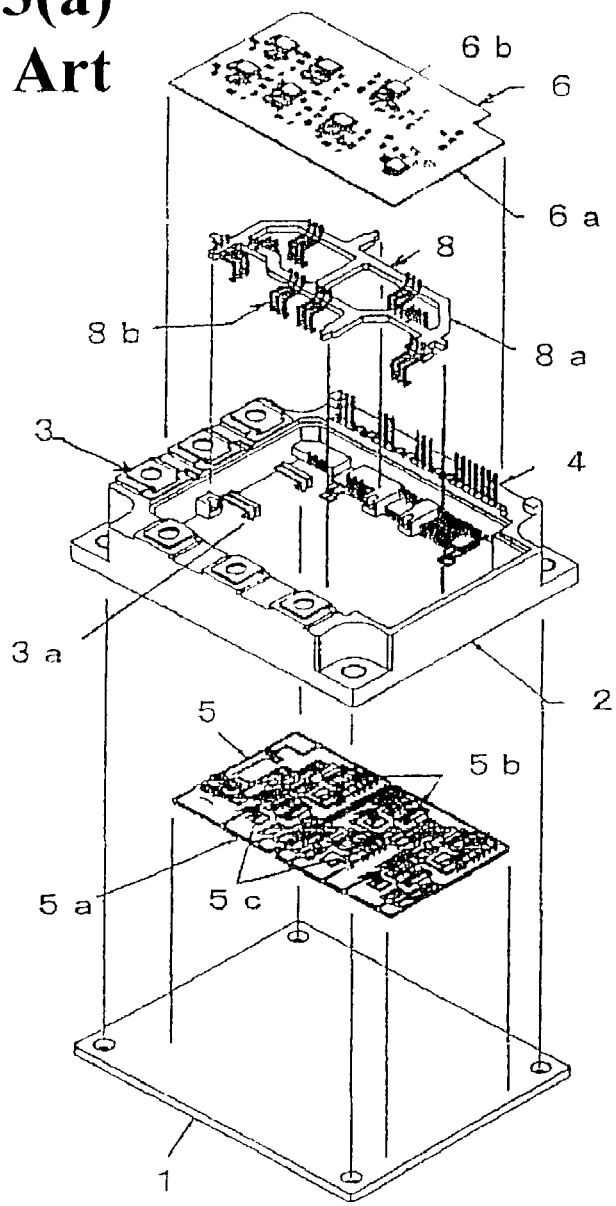
Figure 13B:
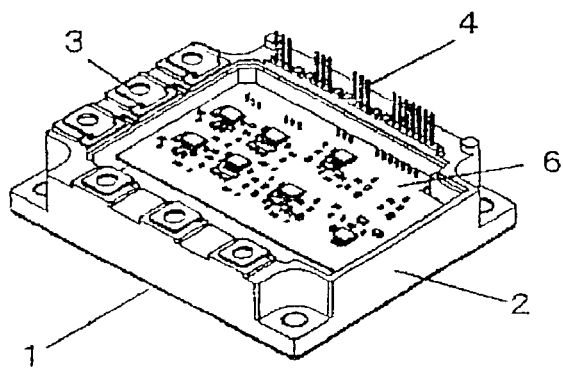

In an inverter as shown in FIG. 11, the cooling fins 25 are installed on a rear surface of the unit case 24. Also, the metal base of the module is placed on a front surface thereof to assemble the IPM 21 in the case, and the printed circuit board 23 of the apparatus is divided into two so that the resulting substrates 23A and 23B are laid parallel with each other in a longitudinal direction within the case and are attached to the main terminals 3 of the IPM 21.

Now, an assembly procedure of such an inverter apparatus will be described with reference to FIGS. 10(*a*)–10(*b*). First, as illustrated in the enlarged view in FIG. 10(*a*), the main terminals 3 of the IPM 21 are each formed (bent) like the character L so that the tips of the lead terminals extend in the same direction. Terminal insertion holes 33*a* corresponding to the arrangement of the main terminals 3 are drilled along an edge of the printed circuit board 23A connected to the main terminals 3 so as to form a row. The printed circuit board 23B connected to the control terminals 4 has a connector 13 installed at an edge thereof and connected to the control terminals (pin terminals).

When the printed circuit boards 23A and 23B are mounted on the IPM 21, the printed circuit board 23A is set perpendicular to the IPM 21 as shown in the figure, and the main terminals 3 of the IPM 21 are laterally inserted into the terminal insertion holes 33*a* drilled in a lower edge of the printed circuit board 23A, and are then soldered to a conductor pattern on the printed circuit board 23A. The connector 13 of the printed circuit board 23B is aligned with the control terminals 4 arranged in a traverse line and is then pushed in so that the control terminals 4 are inserted into the connector 13 for connection. Thus, as shown in FIG. 10(*b*), the printed circuit boards 23A and 23B are connected perpendicular to the IPM 21. Then, the cooling fins 25 are combined with the above described circuit assembly, and the combined structure is integrated into the unit case 24 to constitute the inverter apparatus in FIG. 11. In this manner, the printed circuit boards 23A and 23B are connected perpendicular to the IPM 21 and held thereon to prevent the top surface of the IPM 21 from being blocked by the printed circuit board. Consequently, more heat is radiated to the top surface of the IPM, and noise entering the IPM 21 from the printed circuit board 23 is reduced.

As described above, the configuration of the present invention has the following effects:

(1) It is possible to reduce a size and thickness of a semiconductor, and minimize a wiring path from main terminals through a power circuit and a control circuit to control terminals. Therefore, the apparatus is less likely to have malfunctioning due to wiring inductance, thereby improving reliability.

(2) A printed circuit board of the control circuit can be easily assembled and removed. Even if an intermediate inspection during an assembly process reveals an IC to be defective, the control circuit alone can be easily removed and replaced with a good one.

(3) After the semiconductor device is assembled, a gel-like filler can be injected into the whole interior of the package through a gap opened between the enclosure case and the control terminal block so as to extend over a width thereof without being obstructed by the printed circuit board of the control circuit.

(4) A control terminal block is assembled to the enclosure case as an independent component. Consequently, by using the enclosure case as a common component and setting a length and arrangement of pin terminals of the control terminal block according to a user's specification, it is possible to meet the user's individual requests without an increased cost.

(5) A terminal leader hole opened in a case top cover is set to be larger than contour of a top portion of the control terminal block, and a recessed portion is formed in a peripheral area of the control terminals. Therefore, when the pin terminals of the control terminal block are inserted into a connector mounted on the printed circuit board of the peripheral circuit, the control terminals can be reliably inserted into the connector, while preventing the unwanted interference between the connector and the top cover.

(6) The case top cover is provided with spacing projections on a back surface thereof so that tips of the projections face the printed circuit board of the control circuit. Consequently, even if the top cover is warped or deformed because of a heat cycle, the case top cover is safely prevented from contacting with or crushing the bonding wires installed on the printed circuit board. Further, in addition to these projections, the recess portion is formed on the top surface of the top cover. This avoids unwanted interference with electronic components mounted on a back surface of the printed circuit board of the peripheral circuit, mounted on the top surface of the semiconductor device.

(7) The control terminal block is provided with guide pins for setting the printed circuit board of the control circuit in position. Therefore, an assembly of the printed circuit board and the subsequent soldering of the control terminals can be adequately achieved.

(8) Opposite ends of the control terminal block are fitted into recess portions formed in the enclosure case, and are then joined thereto with adhesive. Adhesive injection holes are opened in support portions of the terminal block located at the respective ends thereof. Furthermore, an adhesive guide channel is formed in a peripheral surface of each support portion and in an inner surface of each recess in the enclosure case. Therefore, in a temporarily assembled state in which the terminal block has been fitted on the enclosure case, the adhesive can be spread over the whole interface for bonding using a dispenser operation based on an X-Y axis robot.

(9) The present invention provides a semiconductor device for use in an inverter apparatus constructed by combining a semiconductor power module such as an IPM with cooling fins and a printed circuit board of the apparatus. The semiconductor device is assembled by inserting main terminals drawn out from a top surface of the package of the module, by soldering to the corresponding terminal insertion holes in the printed circuit board, and by inserting the control terminals into the connector installed on the printed circuit board for connection. In this semiconductor device, the main terminals of the module are composed of pin- or plate-like lead terminals made of a flexible material and are arranged in a line. Further, the lead terminals are formed correspondingly to a mounting position of the printed circuit board of the apparatus to be combined with the module, and are then inserted into and soldered to the corresponding terminal insertion holes in the printed circuit board. This avoids limiting a layout of the module, printed circuit board, and cooling fins to be integrated into a unit case as in the conventional apparatus. Further, even in a layout in which the printed circuit board of the apparatus is laid in a direction different from that of the module, the printed circuit board can be directly inserted into and soldered to the module by bending the main terminals of the module according to a direction of the printed circuit board. Therefore, it is possible to meet the user's individual design requests without changing the package structure of the module.

In these arrangements, it is possible to make the semiconductor device more reliable and to assembly the device more easily.

While the invention has been explained with reference to the specific embodiments of the invention, the explanation is illustrative and the invention is limited only by the appended claims.

What is claimed is:

1. A semiconductor device comprising,
   a package composed of a metal base, an enclosure case having first external lead terminals integrated therewith, and a top cover,
   a filler filled in the package to seal the same,
   a power circuit arranged in the package and having power semiconductor elements mounted thereon, said power circuit being disposed on the metal base and electrically connected to the first external lead terminals,
   a control circuit having a printed circuit board, circuit components mounted on the printed circuit board, and first terminals, said control circuit being mounted in the package above the power circuit,
   a terminal block formed separately from the top cover and extending between side portions of the enclosure case to be directly fixed to the enclosure case, said terminal block being located above the power circuit adjacent the control circuit in a center area of the closure case and having second external lead terminals integrated therewith and second terminals electrically connected with the first terminals of the control circuit, and
   a relay terminal block arranged inside the enclosure case between the power circuit and the control circuit for electrically connecting the same, said relay terminal block having third terminals so that the printed circuit board of the control circuit is held and electrically connected between the third terminals of the relay terminal block and the second terminals of the terminal block, said relay terminal block being located in the enclosure case at a side away from the first external lead terminals so that the control circuit is held between the terminal block and the relay terminal block.

2. A semiconductor device according to claim 1, wherein said circuit components of the control circuit include driving ICs for the power semiconductor elements of the power circuit.

3. A semiconductor device according to claim 2, wherein said driving ICs mounted on the printed circuit board of the control circuit are composed of bare chips.

4. A semiconductor device according to claim 2, wherein said driving ICs mounted on the printed circuit board are arranged according to positions of the power semiconductor elements on the power circuit so that an electrical connection between the driving ICs and the power semiconductor elements is minimized.

5. A semiconductor device according to claim 1, wherein said top cover of the package has a terminal leader slot having a size larger than a top portion of the terminal block.

6. A semiconductor device according to claim 1, wherein said terminal block has support portions formed at respective ends thereof, and said enclosure case of the package has groove portions formed in an inner surface thereof for receiving the support portions of the terminal block to join thereto with adhesive.

7. A semiconductor device according to claim 1, further comprising cooling fins placed on the metal base of the semiconductor device, a first apparatus printed circuit board having terminal insertion holes for receiving the first external terminals of the semiconductor device to be soldered thereto, and a second apparatus printed circuit board having a connector for receiving the second external terminals of the semiconductor device.

8. A semiconductor device according to claim 7, wherein said first external terminals of the semiconductor device are composed of pin-shaped or plate-shaped lead terminals made of a material to be bent easily and are arranged linearly on a top surface of the package, said lead terminals being formed in a shape to fit the terminal insertion holes of the first apparatus printed circuit board and welded thereto.

9. A semiconductor device according to claim 8, wherein said lead terminals are made of copper and are plated with nickel, solder, or gold.

10. A semiconductor device according to claim 7, wherein said first external terminals of the semiconductor device are formed in an L-shape, and said terminal insertion holes are formed along an edge of the first apparatus printed circuit board so that the first apparatus printed circuit board is mounted laterally to the semiconductor device to extend vertically thereto.

11. A semiconductor device according to claim 1, wherein said relay terminal block is located at one side of the package parallel to the terminal block.

12. A semiconductor device comprising,
    a package composed of a metal base, an enclosure case having first external lead terminals integrated therewith, and a top cover,
    a filler filled in the package to seal the same,
    a power circuit arranged in the package and having power semiconductor elements mounted thereon, said power circuit being disposed on the metal base and electrically connected to the first external lead terminals,
    a control circuit having a printed circuit board, circuit components mounted on the printed circuit board, and first terminals, said control circuit being mounted in the package above the power circuit,
    a terminal block formed separately from the top cover and extending between side portions of the closure case, said terminal block being directly fixed to the enclosure case and having second external lead terminals integrated therewith and second terminals electrically connected with the first terminals of the control circuit, and
    a relay terminal block arranged inside the enclosure case between the power circuit and the control circuit for electrically connecting the same, said relay terminal block having third terminals so that the printed circuit board of the control circuit is held and electrically connected between the third terminals of the relay terminal block and the second terminals of the terminal block,
    wherein said first external lead terminals in the enclosure case are arranged on one side of the enclosure case, said terminal block is installed close to a center of a top surface of the enclosure case and arranged parallel to the first external lead terminals, said control circuit is arranged in an area between the terminal block and a side of the enclosure case opposite to the first external lead terminals relative to the terminal block, and said relay terminal block is located at a side away from the first external lead terminals so that the control circuit is held between the terminal block and the relay terminal block.

13. A semiconductor device comprising,
a package composed of a metal base, an enclosure case having first external lead terminals integrated therewith, and a top cover,
a filler filled in the package to seal the same,
a power circuit arranged in the package and having power semiconductor elements mounted thereon, said power circuit being disposed on the metal base and electrically connected to the first external lead terminals,
a control circuit having a printed circuit board, circuit components mounted on the printed circuit board, and first terminals, said control circuit being mounted in the package above the power circuit,
a terminal block formed separately from the top cover and extending between side portions of the enclosure case to be directly fixed to the enclosure case, said terminal block being located above the power circuit adjacent the control circuit in a center area of the closure case and having second external lead terminals integrated therewith and second terminals electrically connected with the first terminals of the control circuit, and
a relay terminal block arranged inside the enclosure case between the power circuit and the control circuit for electrically connecting the same, said relay terminal block having third terminals so that the printed circuit board of the control circuit is held and electrically connected between the third terminals of the relay terminal block and the second terminals of the terminal block, wherein said top cover of the package has spacing projections provided on a back surface thereof, said spacing projection facing the printed circuit board of the control circuit.

14. A semiconductor device according to claim 13, wherein said top cover has a recess portion formed in a top surface thereof, and said spacing projections are provided on a back surface of the recess portion of the top cover.

15. A semiconductor device comprising,
a package composed of a metal base, an enclosure case having first external lead terminals integrated therewith, and a top cover,
a filler filled in the package to seal the same,
a power circuit arranged in the package and having power semiconductor elements mounted thereon, said power circuit being disposed on the metal base and electrically connected to the first external lead terminals,
a control circuit having a printed circuit board, circuit components mounted on the printed circuit board, and first terminals, said control circuit being mounted in the package above the power circuit,
a terminal block fixed to the enclosure case to extend over the same, and having second external lead terminals integrated therewith, second terminals electrically connected with the first terminals of the control circuit, and guide pins for positioning and supporting the printed circuit board of the control circuit, and
a relay terminal block arranged inside the enclosure case between the power circuit and the control circuit for electrically connecting the same, said relay terminal block having third terminals so that the printed circuit board of the control circuit is held and electrically connected between the third terminals of the relay terminal block and the second terminals of the terminal block.

16. A semiconductor device comprising,
a package composed of a metal base, an enclosure case having first external lead terminals integrated therewith, and a top cover,
a filler filled in the package to seal the same,
a power circuit arranged in the package and having power semiconductor elements mounted thereon, said power circuit being disposed on the metal base and electrically connected to the first external lead terminals,
a control circuit having a printed circuit board, circuit components mounted on the printed circuit board, and first terminals, said control circuit being mounted in the package above the power circuit,
a terminal block formed separately from the top cover and extending between side portions of the enclosure case to be directly fixed to the enclosure case, said terminal block being located above the power circuit adjacent the control circuit in a center area of the closure case and having second external lead terminals integrated therewith and second terminals electrically connected with the first terminals of the control circuit, and
a relay terminal block arranged inside the enclosure case between the power circuit and the control circuit for electrically connecting the same, said relay terminal block having third terminals so that the printed circuit board of the control circuit is held and electrically connected between the third terminals of the relay terminal block and the second terminals of the terminal block, wherein said terminal block has support portions formed at respective ends thereof and having adhesive injection holes opened in top surfaces thereof, and said enclosure case of the package has groove portions formed in an inner surface thereof for receiving the support portions of the terminal block to join thereto with adhesive, said groove portions having adhesive guide channels formed at inner surfaces of the groove portions for guiding the adhesive injected through the adhesive injection holes.

* * * * *

UNITED STATES PATENT AND TRADEMARK OFFICE
CERTIFICATE OF CORRECTION

PATENT NO.    : 6,995,461 B2
DATED         : February 24, 2006
INVENTOR(S)   : Shin Soyano et al It is certified that error appears in the above-identified patent and that said Letters Patent is hereby corrected as shown below:

Drawings,
Fig. 5(b), change "1c" to -- 11c --;

Fig. 5(b)

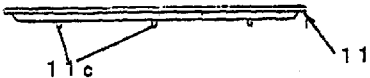

Column 3,
Line 41, change "Tie" to -- The --;

Column 5,
Line 19, change "Interface" to -- interface --;

Column 6,
Line 29, change "modified-example" to -- modified example --;

Column 7,
Line 32, change "in" to -- In --.

Signed and Sealed this

Sixteenth Day of May, 2006

JON W. DUDAS
*Director of the United States Patent and Trademark Office*

UNITED STATES PATENT AND TRADEMARK OFFICE
CERTIFICATE OF CORRECTION

PATENT NO. : 6,995,461 B2  Page 1 of 1
DATED : February 7, 2006
INVENTOR(S) : Shin Soyano et al.

It is certified that error appears in the above-identified patent and that said Letters Patent is hereby corrected as shown below:

Drawings,
Fig. 5(b), change "1c" to -- 11c --;

Fig. 5(b)
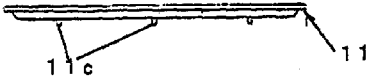

Column 3,
Line 41, change "Tie" to -- The --;

Column 5,
Line 19, change "Interface" to -- interface --;

Column 6,
Line 29, change "modified-example" to -- modified example --;

Column 7,
Line 32, change "in" to -- In --.

This certificate supersedes Certificate of Correction issued May 16, 2006.

Signed and Sealed this

Sixth Day of June, 2006

JON W. DUDAS
*Director of the United States Patent and Trademark Office*